United States Patent [19]

Edlund

[11] 4,417,164
[45] Nov. 22, 1983

[54] MECHANICAL VALVE ANALOG

[75] Inventor: Carl E. Edlund, Castroville, Tex.

[73] Assignee: Southern Gas Association, Dallas, Tex.

[21] Appl. No.: 275,068

[22] Filed: Jun. 18, 1981

[51] Int. Cl.³ .................. H03K 4/00; H03K 5/153; H03K 3/26

[52] U.S. Cl. .................. 307/497; 307/362; 307/571

[58] Field of Search .......... 307/571, 575, 577, 497, 307/354, 362, 363, 549, 550, 558, 567, 568, 570, 555

[56] References Cited

U.S. PATENT DOCUMENTS

| 2,731,571 | 1/1956 | Chance | 307/555 |
| 2,936,041 | 5/1960 | Sharp et al. | 181/47 |
| 2,951,638 | 9/1960 | Hughes et al. | 235/183 |
| 2,979,940 | 4/1961 | Damewood et al. | 73/71.4 |
| 2,997,124 | 8/1961 | Damewood et al. | 181/47 |
| 3,502,905 | 3/1970 | Bicking | 307/570 |
| 3,509,372 | 4/1970 | Bicking | 307/497 |

Primary Examiner—John S. Heyman
Assistant Examiner—Timothy P. Callahan
Attorney, Agent, or Firm—Hubbard, Thurman, Turner & Tucker

[57] ABSTRACT

A device suitable for use as an electrical analog of a unidirectional mechanical valve includes a three-terminal MOSFET. A sensing comparator has inputs coupled to the drain and source terminals of the FET, and an output coupled to the gate of the FET. A floating power supply allows the analog to operate independently of the circuit in which it is used. The FET will conduct current whenever the voltage from the drain to the source exceeds a threshold value, and will effectively act as an open circuit whenever the drain to source voltage is less than this threshold.

1 Claim, 2 Drawing Figures

MECHANICAL VALVE ANALOG

BACKGROUND OF THE INVENTION

The present invention relates generally to electrical unidirectional current devices, and more specifically to a device which is suitable for use as a model of a unidirectional mechanical valve.

Installation or modification of natural gas or other fluid distribution systems requires consideration of a number of factors before work is undertaken. Variations in loads, distribution paths, pipe sizes and compressor speeds all have effects on the operation of the system as a whole. Compression waves created in the gas by the operation of reciprocating pumps and compressors are especially troublesome as resonances can be set up in the system. Acoustical resonance increases metal fatigue and shortens the life of joints, valves and other components of the system.

To assist in planning for the control of undesirable pulsations and vibrations in a system, an electrical analog of all fluid transfer components can be created. Present electrical systems analogize current to mass flow of the gas and voltage to pressure. Inductors, capacitors and resistors are used to model the mechanical properties of pipes and other components in the distribution system. A detailed model of a distribution system or subsystem can be set up and studied to predict the effects caused by changing various parameters in the operation of the system. Examples of the use of gas pumping systems analogs are found in U.S. Pat. Nos. 2,951,638 and 2,979,940.

Reciprocating pumps and compressors utilize unidirectional mechanical valves at the intake and discharge ports of the cylinder. These valves will open and allow gas to flow when the fluid pressure at the upstream end is greater than that at the downstream end. No fluid will flow when the pressure at the downstream end of the valves is greater than that at the upstream end. In a capacitor charge pump model of a reciprocating compressor, voltage is utilized as the electrical analog of fluid pressure. Semiconductor diodes are presently utilized as the electrical analogs of unidirectional mechanical valves. An ideal diode would only conduct current from the anode to the cathode, and only when voltage is greater than the voltage at the cathode.

The properties of actual diodes differ from that of the ideal diode, and their use in such circuits has several major drawbacks. One drawback is the presence of a voltage drop across the diode when it is conducting current. This voltage drop can cause the diode to present a substantial effective resistance when conducting small currents. For example, with a typical voltage drop of 0.7 volts, a diode conducting 0.1 mA presents an effective resistance to current flow of 7,000 ohms. Another important drawback of semiconductor diodes is that the diode will not begin to conduct current until the voltage difference between the anode and the cathode reaches the turn-on voltage, which is typically around 0.5 volts. A diode wil not switch to the conducting state and begin to conduct current until this threshold difference is reached. Yet another drawback is that a diode does not change from the nonconducting to the conducting state immediately, but rather has a finite switching speed which depends in part on the rate of change of the voltage across the diode.

The operation of a diode is adversely affected by the junction capacitance between the anode and the cathode. Further, the effective resistance of the diode does not behave in a manner analogous to the resistance to fluid flow presented by a mechanical valve. In a mechanical valve, increasing fluid flow causes increasing resistance. Contrariwise, higher current through a semiconductor diode gives a lower effective resistance.

SUMMARY OF THE INVENTION

It is therefore an object of the present invention to provide an electrical device which can be used to model the action of a unidirectional mechanical valve.

It is another object of the present invention to provide such an electronic device which has a low resistance to current when in the conducting state.

It is yet another object of the present invention to provide such an electronic device which is sensitive to small voltage differences between the upstream and downstream ends.

It is a further object of the present invention to provide such a device which has a short switching time between the conducting and nonconducting states, with such time being independent of the rate of change of the voltage across the device.

In order to accomplish the above and other objects, the present invention provides for an electric circuit having input and output terminals, said circuit incorporating a field effect transistor (FET). The transistor has drain and source terminals connected to the input and output terminals of the circuit. A voltage comparator has inputs connected to the drain and source terminals of the FET. The comparator output is coupled to the gate of the FET. The power supply for the voltage comparator is floating, so that the device is unaffected by the remainder of the electrical system.

The novel features which characterize the present invention are defined by the appended claims. The foregoing and other objects and advantages of the invention will hereinafter appear, and for purposes of illustration, but not of limitation, a preferred embodiment is shown in the accompanying drawings.

DETAILED DESCRIPTION OF THE PREFERRED EMBODIMENT

The present invention relates to a new and improved means for modeling the action of a unidirectional mechanical valve, such as those used in gas compressors and pumps.

Figure 1:
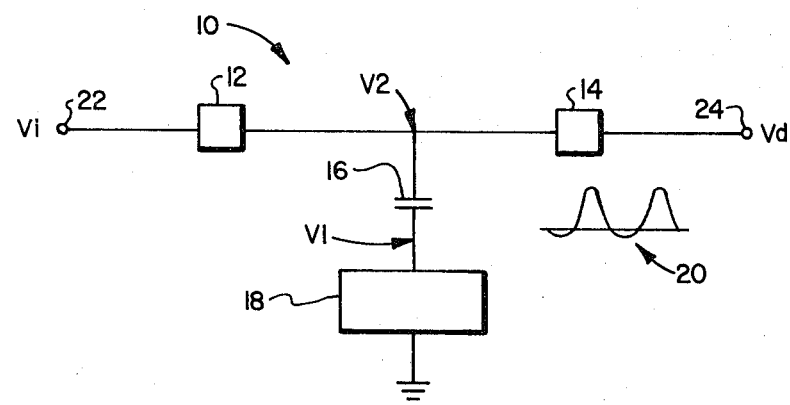
FIG. 1 is a block diagram of an electrical analog of a reciprocating compressor.

An electrical model 10 of a reciprocating fluid pump or compressor is shown in FIG. 1. The compressor model 10 includes intake and discharge valves 12 and 14 which model the actions of mechanical intake and discharge valves. A capacitor 16 models the volume of a mechanical cylinder. The mechanical driving input to the compressor is modeled by a voltage output from a signal source 18.

An intake voltage $V_i$ and a discharge voltage $V_d$, at intake and discharge terminals 22 and 24, model the static pressures of the fluid at the intake and discharge ports respectively of the mechanical compressor. The intake voltage $V_i$ would normally be substantially less than the discharge voltage $V_d$ if the analog circuit 10 were modeling a compressor, and more nearly equal in value if the analog 10 were modeling a pump. The model 10 acts as a charge pump, drawing current through the intake valve 12 onto the capacitor 16 at the lower intake voltage Vi, and expelling it through the discharge valve 14 at the higher discharge voltage Vd. This is accomplished by applying an alternating voltage signal V1 to the capacitor 16. The capacitor 16 has a fixed value and is modeling a varying volume of the mechanical cylinder, so that voltage V1 must be shaped, preferably as shown as 20, by the source 18 in compensation. The shaped signal V1 can be approximately described as a sinusoid having enlarged positive lobes. For a more detailed explanation of the operation of the analog 10 as a model of a reciprocating pump, see U.S. Pat. No. 2,951,638.

The intake and discharge valves 12, 14 are devices which allow unidirectional current flow. Presently, diodes are employed to model the valve 12,14. Both diodes are orineted to allow current to flow from the intake terminal 22 to the capacitor 16, and from the capacitor 16 to the discharge terminal 24. In FIG. 1, both diodes are oriented with the anode to the left, allowing current to flow only from left to right in each case.

The voltage across the capacitor 16 remains constant when neither valve 12, 14 is conducting, with the charge on the capacitor 16 remaining constant. Thus, the voltage V2 at the junction of the capacitor 16 and the valves 12, 14 will track the signal source voltage V1 when neither diode is conducting.

When the signal voltage V1 drops low enough, the junction voltage V2 will decrease to a level slightly below the intake voltage Vi, which causes charge to flow onto the capacitor 16 through the intake valve 12. When the signal V1 begins to increase, the intake valve 12 ceases to conduct and the junction voltage V2 rises to the discharge voltage Vd level. When the driving signal V1 forces the junction voltage V2 slightly above the discharge voltage Vd, the discharge valve 14 conducts and the charge on the capacitor 16 flows through the discharge valve 16 as current. When the driving signal V1 begins to drop again, the junction voltage V2 also drops, which causes the discharge valve 16 to turn off. The voltage across the capacitor 16 now remains constant, and the junction voltage V2 falls along with the signal voltage V2. When the voltage V2 falls slightly below the intake voltage V1, the intake valve 12 turns on and the cycle is repeated.

Diodes are presently used to model the action of the intake and discharge valves 12 and 14, but they have several inherent limitations. A major drawback is that diodes do not begin to conduct until the voltage at the anode is several tenths of a volt higher than the cathode voltage. Also, the current-voltage curve of a diode does not have a sharp break, so that the diode turns on relatively gradually as voltage differences of a few tenths of a volt are achieved across the diode. Thus, the diode does not behave as a true two-state device having a virtually nonexistent transition zone. Further, the effective resistance of a diode decreases with increasing current, while the resistance of a mechanical valve increases with increasing fluid flow.

Figure 2:
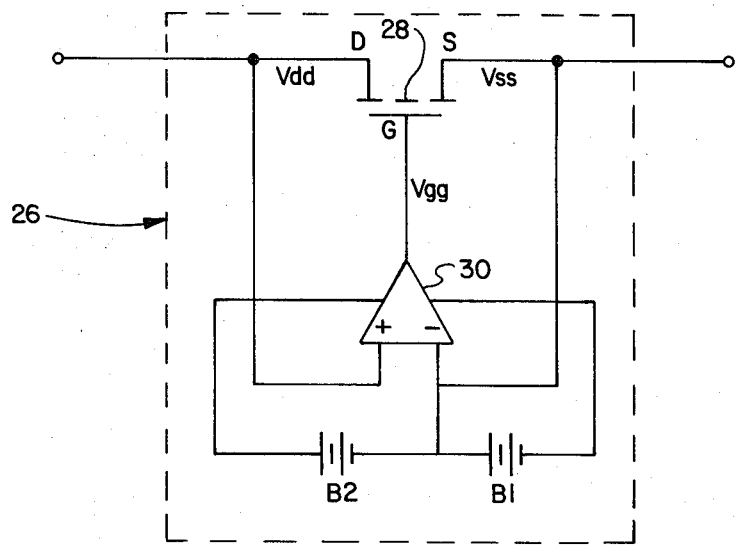
FIG. 2 is a schematic diagram of a unidirectional mechanical valve analog.

Therefore, an improved electrical unidirectional device 26 suitable for use in modeling the mechanical unidirectional valves 12, 14 is shown in FIG. 2. A transistor 28 having drain (D), source (S) and gate (G) terminals is preferably an N-channel enhancement mode field effect transistor. The transistor 28 conducts current between the drain and source terminals D and S when the gate voltage Vgg is higher than the source voltage Vss. In this state, the transistor 28 is turned on, and there is a very low resistance to current flow between the drain D and the source S. When the gate to source voltage (Vgg-Vss) is below the threshold of the transistor, the drain to source path (D to S) is essentially an open circuit.

The drain terminal D is coupled to the positive input of a voltage comparator 30, and the source terminal S is connected to the negative input of the comparator 30. The output of the comparator 30 is coupled to the gate terminal G of the transistor 28. Power is supplied to the comparator 30 by batteries B1 and B2, which provide a floating voltage supply independent of the external circuit. The batteries B1, B2 provide the same voltage, and the negative input of the comparator 30 is coupled to the junction between them. This references the comparator 30 to the source voltage Vss, instead of to a fixed value. The lift of the batteries B1, B2 is quite long, because the power requirements of this device 26 are very low. The input resistances to the comparator 30 are high, and no current flows through the gate G, so there is no input or output current to the comparator 30. The only current used is that drawn by the comparator 30 itself during operation.

The output Vgg from the comparator 30 will be substantially equal to either the positive or negative voltage supply, which is defined by B1 and B2 as referenced to Vss, depending on the magnitude of the voltages into the positive and negative inputs of the comparator 30. Switching of the comparator output Vgg between the positive and negative value is extremely fast and is limited only by the slew rate of the comparator 30.

In operation, if the source voltage Vss is greater than the drain voltage Vdd, the voltage at the negative input to the comparator 30 is greater than that at the positive, and the comparator output Vgg is substantially equal to the lowest voltage supplied by the power supply of B1 and B2. This voltage will be lower than Vss by the voltage supplied by battery B1. If the source voltage Vss drops below the drain voltage Vdd, then the comparator output Vgg will switch to the maximum positive voltage supplied by the power supply, which will be grater than Vss by the voltage supplied by battery B2. This causes the gate voltage Vgg to be positive with respect to the source voltage Vss, which switches the transistor 30 into the conducting state. Current is now free to flow from the drain D to the source S.

When the transistor 30 is in the conducting state, and the drain voltage Vdd falls below the source voltage Vss, the gate voltage Vgg will be driven negative with respect the source voltage Vss, which turns off the transistor 30. It is thus seen that the device 26 acts to conduct current whenever the drain voltage Vdd is higher than the source voltage Vss, and to present an open circuit when the source voltage Vss is higher than the drain voltage Vdd.

By inserting a floating voltage source (not shown) in either the line from the source S to the negative input of the comparator 30, or the line from the drain D to the positive input of the comparator, an offset can be introduced into the device 26. The direction and location of the floating source determine whether the device 26 will change states when the drain D is at a higher potential than the source S, or vice versa. For example, with a 1 volt battery coupled into the source S to comparator 30 input line, oriented with the positive terminal toward the comparator 30, the device 26 will change states when the drain D becomes more or less than 1 volt greater than the source S. Such an offset permits the modeling of present pressure relief vlaves.

The analog 20 can be used to directly replace the diode valve analogs 12, 14 in the circuit of FIG. 1. The improved analog 26 is used as the intake valve model 12 by coupling the drain D to the intake terminal 22, and the source S to the capacitor 16. The device 26 is used as the discharge valve analog 14 by coupling the drain D to the capacitor 16, and the source S to the discharge terminal 24.

Due to the high gain of the comparator 30, the apparatus 26 is extremely sensitive to very small differences in the drain and source voltages Vdd and Vss. For example, if the comparator 30 has an open loop gain of 100,000, a voltage difference of approximately 0.0001 volts will be enough to trigger the device 26 into the proper conducting or nonconducting state. Further, this transition is made very quickly, being dependent only on the slew rate of the comparator 30.

The transition can be delayed by using complex impedances in a feedback arrangement around the comparator 30. Delayed transitions can be used to model the dynamic valve response of valves which show a measurable time delay before operating after relatively fast pressure changes.

Since there is no junction between the drain D and source S, there is no junction capacitance between them. The resistance between the drain D and source S is proportional to current flow, so that a larger current causes a larger resistance to appear on the device 26, and a smaller current gives a smaller resistance. In either case, the actual resistance is quite small, and depends on the parameters of the particular transistor 28 chosen for use in the devices. The power for the comparator 30 is supplied by floating batteries B1 and B2 so that the drain and source voltages Vdd and Vss are compared only with each other, and not referenced to any other part of the overall circuit 10. The device 26 can thus be used in any circuit to model an ideal diode, which it does much more accurately than a conventional diode. The use of these devices 26 in electrical analogs 10 of fluid pumps to model unidirectional valves 12, 14 is especially appropriate.

Although a preferred embodiment has been described in detail, it should be understood that various substitutions, alterations and modifications may become apparent to those skilled in the art. These changes may be made without departing from the spirit and scope of the invention as defined by the appended claims.

What is claimed is:

1. An apparatus for electrically simulating, in an electrical analog of a fluid pump, the action of a unidirectional mechanical valve, comprising:
   an input terminal which corresponds to the input of the mechanical valve;
   an output terminal which corresponds to the output of the mechanical valve;
   a field effect transistor having a gate, a drain and a source, wherein the drain and source are coupled to said input and output terminals;
   a voltage comparator having a positive input coupled to said input terminal, a negative input coupled to said output terminal, and an output coupled to the transistor gate; and
   a voltage supply having positive, negative and middle supply outputs, wherein the positive supply output is coupled only to a positive supply terminal of said comparator, and further wherein the negative supply output is coupled only to a negative supply terminal of said comparator, and further wherein the middle output is coupled only to the comparator negative input, whereby said voltage supply is referenced to whatever voltage may be present at said output terminal.

* * * * *